United States Patent
Higgins, III et al.

(10) Patent No.: US 9,059,144 B2
(45) Date of Patent: Jun. 16, 2015

(54) METHOD FOR FORMING DIE ASSEMBLY WITH HEAT SPREADER

(75) Inventors: Leo M. Higgins, III, Austin, TX (US); Burton J. Carpenter, Austin, TX (US); Glenn G. Daves, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/403,458

(22) Filed: Feb. 23, 2012

(65) Prior Publication Data
US 2013/0221511 A1  Aug. 29, 2013

(51) Int. Cl.
 *H01L 23/34* (2006.01)
 *H01L 23/433* (2006.01)
 *H01L 21/56* (2006.01)
 *H01L 23/31* (2006.01)

(52) U.S. Cl.
 CPC ... *H01L 23/4334* (2013.01); *H01L 2224/73215* (2013.01); *H01L 2224/16225* (2013.01); *H01L 2224/32225* (2013.01); *H01L 2224/32245* (2013.01); *H01L 2224/48227* (2013.01); *H01L 2224/48247* (2013.01); *H01L 2224/73253* (2013.01); *H01L 2224/73265* (2013.01); *H01L 2924/15311* (2013.01); *H01L 2924/1815* (2013.01); *H01L 21/566* (2013.01); *H01L 23/3128* (2013.01)

(58) Field of Classification Search
 CPC ............. H01L 23/49568; H01L 23/3677; H01L 23/3672
 See application file for complete search history.

(56) References Cited

U.S. PATENT DOCUMENTS

| | | | |
|---|---|---|---|
| 5,216,283 A | 6/1993 | Lin | |
| 5,483,098 A | 1/1996 | Joiner, Jr. | |
| 5,977,626 A | 11/1999 | Wang et al. | |
| 6,146,921 A | 11/2000 | Barrow | |
| 6,191,360 B1* | 2/2001 | Tao et al. | 174/522 |
| 6,219,243 B1* | 4/2001 | Ma et al. | 361/704 |
| 6,432,742 B1 | 8/2002 | Guan et al. | |
| 6,538,321 B2* | 3/2003 | Huang et al. | 257/706 |
| 6,667,439 B2 | 12/2003 | Salatino et al. | |
| 6,734,552 B2 | 5/2004 | Combs et al. | |
| 6,737,755 B1 | 5/2004 | McLellan et al. | |
| 6,800,948 B1 | 10/2004 | Fan et al. | |
| 6,882,041 B1 | 4/2005 | Cheah et al. | |
| 6,967,126 B2 | 11/2005 | Lee et al. | |

(Continued)

OTHER PUBLICATIONS

U.S. Appl. No. 13/205,228, Leo M. Higgins, III, Semiconductor Package with a Heat Spreader and Method of Making, filed Aug. 8, 2011.

(Continued)

*Primary Examiner* — Brett Feeney
*Assistant Examiner* — Damian A Hillman

(57) ABSTRACT

A method for forming a molded die assembly includes attaching a first major surface of a semiconductor die onto a package substrate; attaching a heat spreader to a second major surface of the semiconductor die, wherein the second major surface is opposite the first major surface, and wherein the semiconductor die, package substrate, and heat spreader form a die assembly; conforming a die release film to a transfer mold; closing the transfer mold around the die assembly such that the die release film is compressed against the heat spreader and a cavity is formed around the die assembly; transferring a thermoset material into the cavity; and releasing the die assembly from the die release film and the transfer mold.

20 Claims, 5 Drawing Sheets

(56) References Cited

U.S. PATENT DOCUMENTS

| | | |
|---|---|---|
| 6,979,594 B1 | 12/2005 | Fan et al. |
| 7,180,173 B2 | 2/2007 | Kuo et al. |
| 7,672,132 B2 * | 3/2010 | Fitzgerald et al. ............ 361/702 |
| 7,692,276 B2 * | 4/2010 | Lee .............................. 257/676 |
| 7,776,648 B2 * | 8/2010 | Chua et al. ................... 438/106 |
| 8,049,313 B2 * | 11/2011 | Foong et al. ................. 257/675 |
| 8,258,013 B1 * | 9/2012 | Nagarajan et al. ........... 438/115 |
| 2002/0195701 A1 | 12/2002 | Bemmerl et al. |
| 2004/0245653 A1 | 12/2004 | Lee et al. |
| 2008/0128897 A1 * | 6/2008 | Chao ............................. 257/713 |
| 2010/0019379 A1 * | 1/2010 | Zhao et al. .................... 257/713 |
| 2012/0280374 A1 * | 11/2012 | Choi et al. .................... 257/659 |

OTHER PUBLICATIONS

Buschman Technologies, "Film Assisted Molding", www.boschman.nl/index.php/molding-principles/film-assisted-molding.html.

Extended European Search Report issued in Corresponding EP Application No. 13151824.3-1555/2631941.

\* cited by examiner

METHOD FOR FORMING DIE ASSEMBLY WITH HEAT SPREADER

BACKGROUND

1. Field

This disclosure relates generally to semiconductor devices, and more specifically, to a method of forming a semiconductor package with a heat spreader.

2. Related Art

Heat is generated by an integrated circuit (IC) die during operation. If inadequately removed, the heat generated by the die may cause the device to fail or to perform erratically. As such, heat spreaders are often incorporated into semiconductor packages to improve the thermal performance of the IC.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and assemblies disclosed herein greatly improve the thermal dissipation of transfer molded packages using a technique of bonding of a heat spreader directly to the junction surface of an integrated circuit die, or directly to the back side of a flip chip die and molding a package around the die/heat spreader assembly. Transfer molding may include a process called film assisted molding (FAM) which uses a soft film as a gasket material between a mold tool pedestal and the heat spreader. Heat spreaders of various designs are attached to a surface of the IC die with a compliant thermal interface material (TIM) that bonds the heat spreader to the die. The heat spreader and die are assembled before the mold operation. The heat spreader can have many variations not known with other thermally enhanced BGAs (e.g. heat spreader may have protrusions that extend partially or all the way to the substrate surface, not just the die face region). The processes disclosed herein can be applied to many types packages such as PBGA, Fine Pitch BGA/MAPBGA, any form of QFP, QFN, PQFN, SOIC, TSSOP, etc. as well as multi-chip/System-in-Package configurations.

Figure 1:
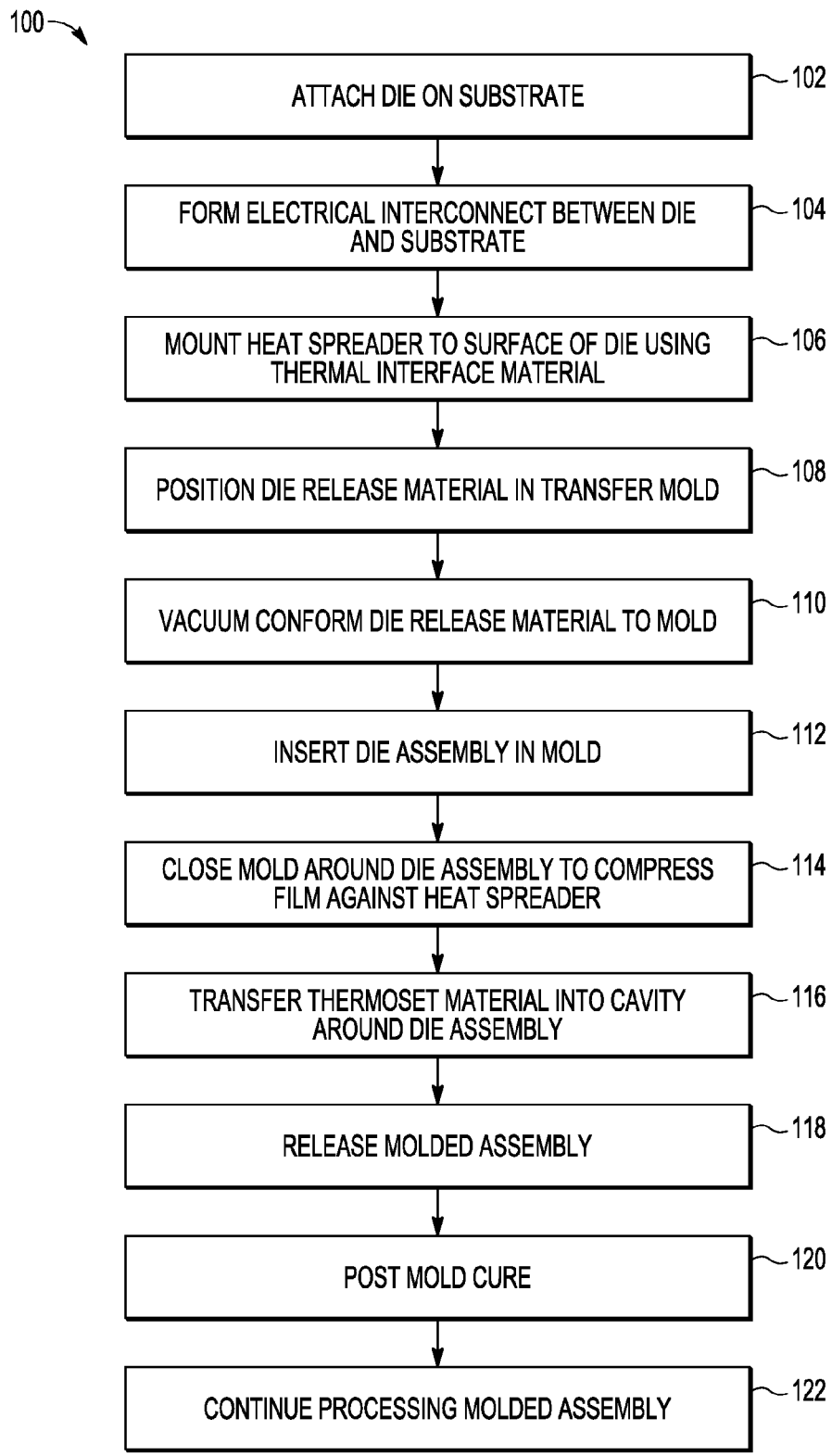
FIG. 1 is a flow diagram of an embodiment of a method for forming a semiconductor die assembly with an integrated heat spreader.
Figure 2:
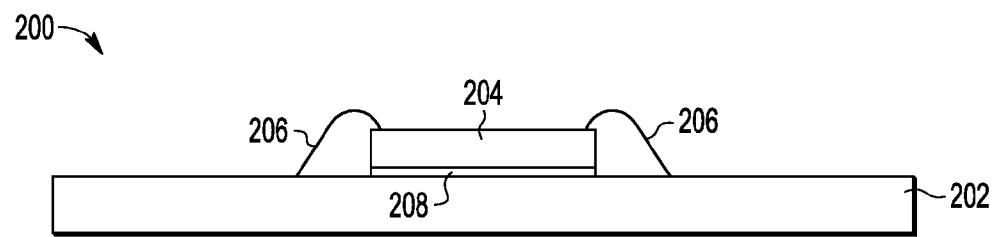
FIGS. 2-7 show embodiments of a die assembly with an integrated heat spreader during successive stages of processing.

Referring to FIGS. 1 and 2, FIG. 1 is a flow diagram of an embodiment of a method for forming a semiconductor die assembly with an integrated heat spreader. Process 102 can include attaching an IC die on a substrate. FIG. 2 shows an example of IC die 204 attached to substrate 202. The IC die 204 can be a flip chip or a wire bond die. The substrate 202 can be a lead frame or other type of semiconductor packaging substrate. The IC die 204 can be attached using a layer of die attach material 208 such as an adhesive paste or film. While FIG. 2 shows only a single die assembly 200 for purposes of simplicity, it is understood that the die assembly described herein may be applied to an array of die assemblies formed on a lead frame or other type of substrate array.

In process 104, electrical interconnects are formed between the IC die 204 and the substrate 202. The electrical interconnects can include wire bonds 206. Alternatively, the electrical interconnects can be established by bumps on a flip chip (not shown in FIG. 1 or 2) that contact electrical contacts on the substrate. Other suitable techniques for establishing electrical interconnectivity between the IC die 204 and the substrate 202 can be used.

Figure 3:
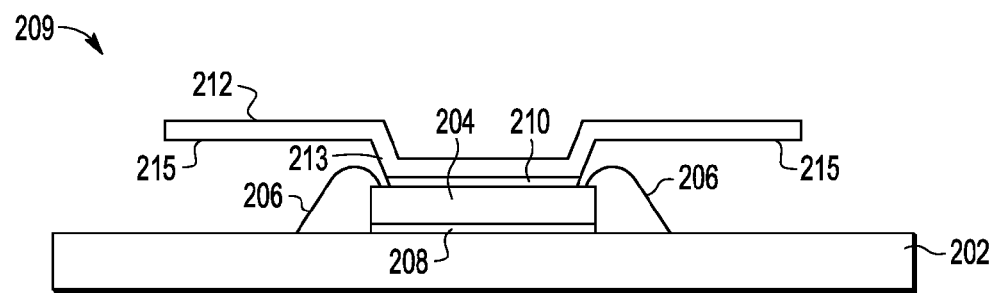

Referring to FIGS. 1 and 3, FIG. 3 shows an IC die/heat spreader assembly 209 formed by process 106. Process 106 can include mounting a heat spreader 212 to the surface of the IC die 204 so that at least a portion of the heat spreader 212 is bonded to a portion of the IC die 204. The heat spreader 212 is usually formed of a thermally conductive material such as a metal and can extend up to the edge of the substrate 202 or less to provide the desired amount of heat dissipation. In some embodiments, the heat spreader 212 can include a pedestal portion 213 that contacts IC die 204. The pedestal portion 213 is formed or stamped, or etched, to raise the outer edges of the heat spreader 212 so that the heat spreader 212 does not contact or interfere with wire bonds 206 around the edges of IC die 204. In other embodiments that use IC die 204 without wire bonds 206 or other structures on the surface facing the heat spreader 212, the heat spreader 212 can be flat.

Figure 11:
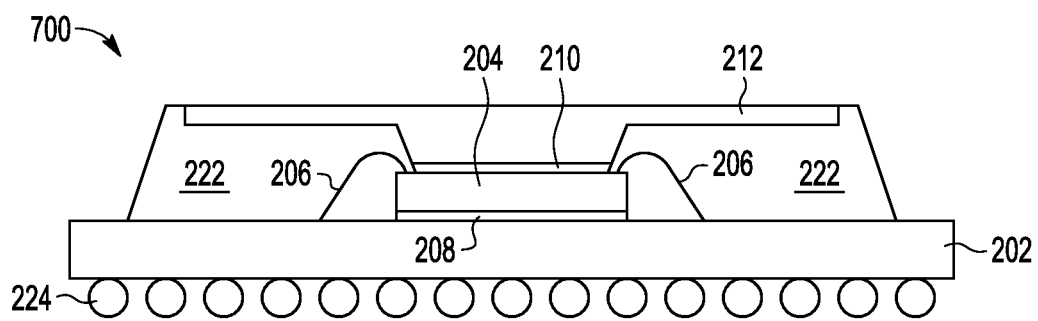
FIG. 11 shows another embodiment of a die assembly with an integrated heat spreader.

Pedestal portion 213 can have any suitable shape. In the embodiment shown, pedestal portion is formed by a flat sheet of material that is stamped in a central area so that the central area extends below side extensions 215. The material thickness of pedestal portion 213 is approximately the same as the side extensions 215. In other embodiments, pedestal portion 213 can be solid, with the top of pedestal portion 213 flush with the top of side extensions 215 and pedestal portion 213 being thicker than side extensions 215, as shown, for example, in FIG. 11.

A thermal interface material 210 can be used to mount or attach or bond the heat spreader 212 to the IC die 204. For example, the thermal interface material 210 can be a filled silicone gel material, a filled epoxy material, a filled grease, or other suitable material that is capable of withstanding subsequent assembly operations and operational conditions at expected temperatures and has good heat transfer characteristics.

Figure 4:
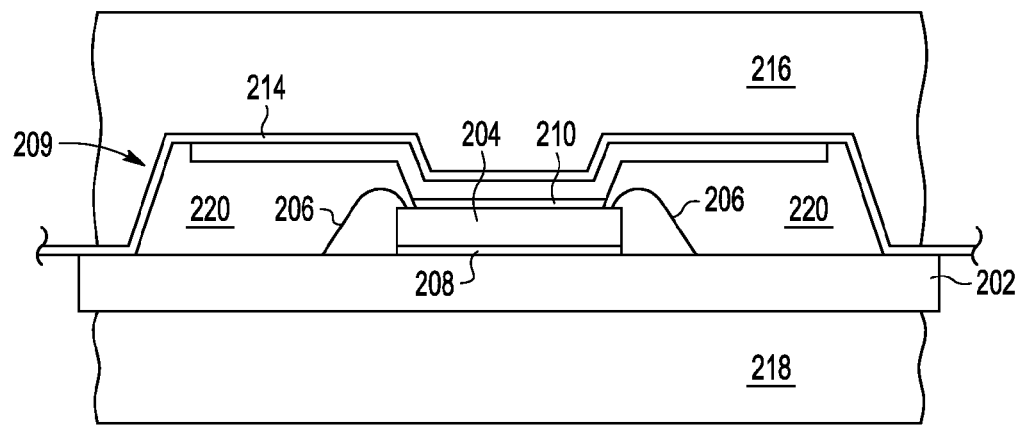

Referring to FIGS. 1 and 4, FIG. 4 shows an IC die/heat spreader assembly 209 between upper and lower portions of a film assisted molding (FAM)) transfer mold 216, 218. Process 108 can include positioning a layer of a die release material 214 between transfer mold 216 and the heat spreader 212, and in some embodiments between substrate 202 and transfer mold 218. In some embodiments, the die release material 214 can be ethyltetrafluoroethylene (ETFE) or other suitable material. The die release material 214 prevents thermoset transfer mold compound (not shown) and the IC die/heat spreader assembly 209 from sticking to the transfer mold 216. In some embodiments when thermoset transfer mold compound is exposed on upper and lower sides of the IC die/heat spreader assembly 209, the die release material 214 can be positioned in upper and lower transfer molds 216, 218. As used herein, the term "mold compound" refers to thermoset transfer mold compound.

Process 110 can include applying a vacuum force to conform the die release material 214 to the shape of the upper and/or lower transfer molds 216, 218.

Once the die release material 214 is conformal to the mold(s) 216, 218, process 112 can include inserting the IC die/heat spreader assembly 209 between upper transfer mold 216 and lower transfer mold 218. Once the IC die/heat spreader assembly 209 is inserted, process 114 can include closing the mold(s) 216, 218 around the die assembly 209 to compress the die release film 214 against the heat spreader 212 and any other surface regions for which the system is designed, including as examples regions of substrate 202 and regions of transfer molds 216, 218. A cavity 220 is formed between substrate 202 and heat spreader 212 once upper and lower transfer molds 216, 218 are closed around the die assembly 209.

Figure 5:
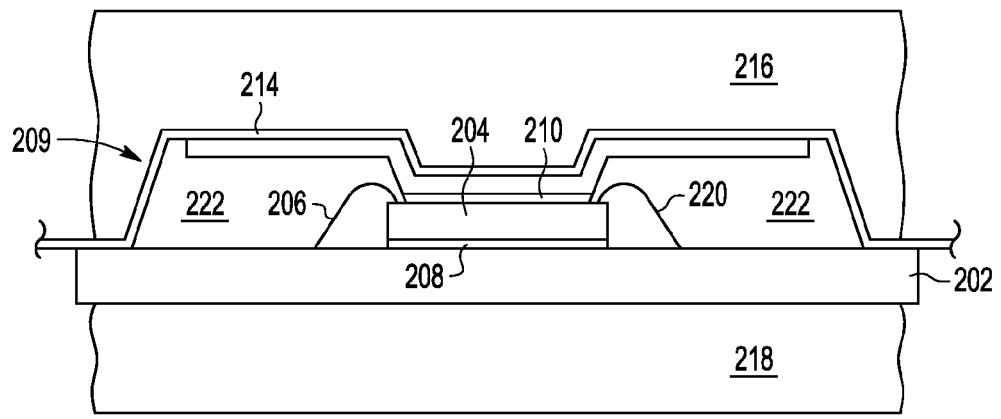

Referring to FIGS. 1 and 5, process 116 can include transferring a thermoset mold compound 222 into the cavity 220 (FIG. 4). FIG. 5 shows an embodiment with mold compound 222 filing cavity 220 (FIG. 4). In some processes, the mold compound is introduced to the cavity 220 through an opening (not shown) between the upper and lower transfer molds 216, 218. Any suitable thermoset mold compound such as, but not limited to, an epoxy material filled with fused silica and other fillers or additives, can be used in process 116.

Figure 6:
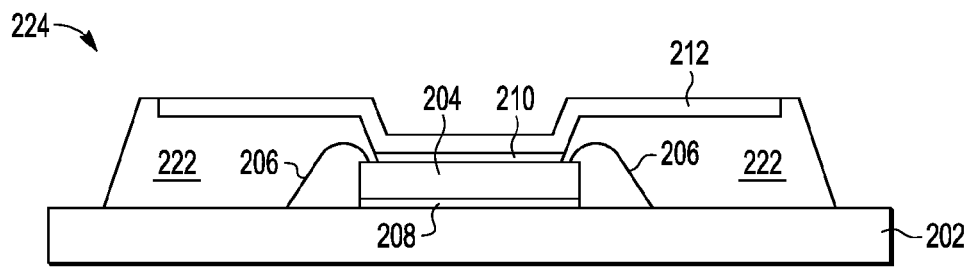

Referring to FIGS. 1 and 6, FIG. 6 shows a result of process 118 in which die assembly 224 is released from transfer molds 216, 218 (FIG. 5) after mold compound 222 has been transferred into cavity 220 (FIG. 4).

Process 120 can include allowing die assembly 224 to cure for a specified amount of time and/or at a specified temperature or other conditions.

Figure 7:
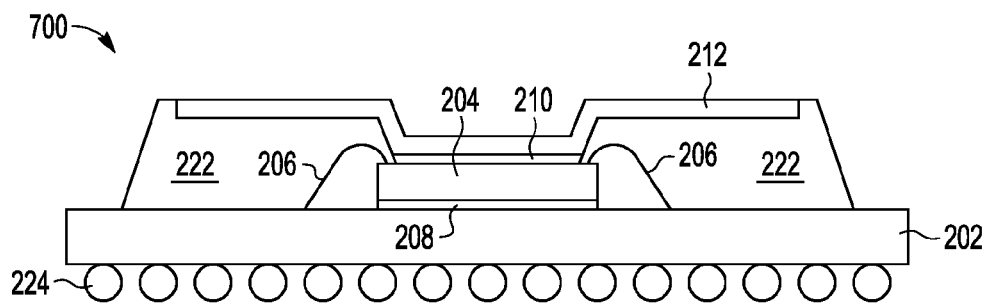

Referring to FIGS. 1 and 7, process 122 can include performing subsequent processing of die assembly 700, such as forming a ball grid array 224 on substrate 202 as shown in FIG. 7, singulating die assembly 224 from an array or frame, and/or testing/measurement/inspection processes.

Figure 8:
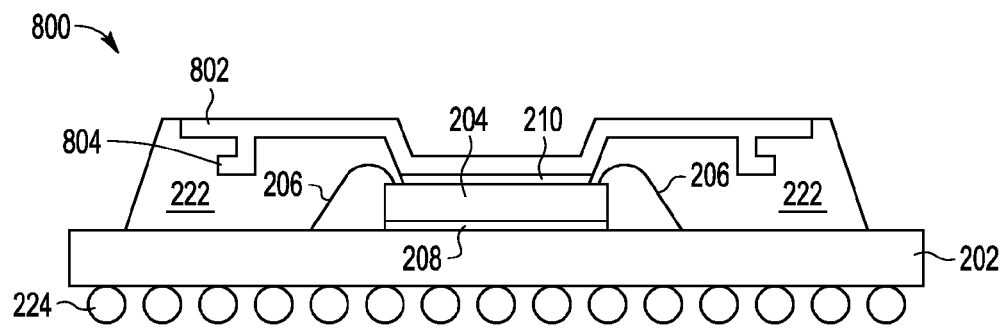
FIG. 8 shows another embodiment of a die assembly with an integrated heat spreader.

FIG. 8 shows another embodiment of a die assembly 800 with an integrated heat spreader 802 that includes locking features 804 that anchor heat spreader 802 to mold compound 222. In the example shown, locking features 804 are inverted L-shaped members that extend from heat spreader 804 into mold compound 222 but members with other shapes can be used to provide a similar locking function.

Figure 9:
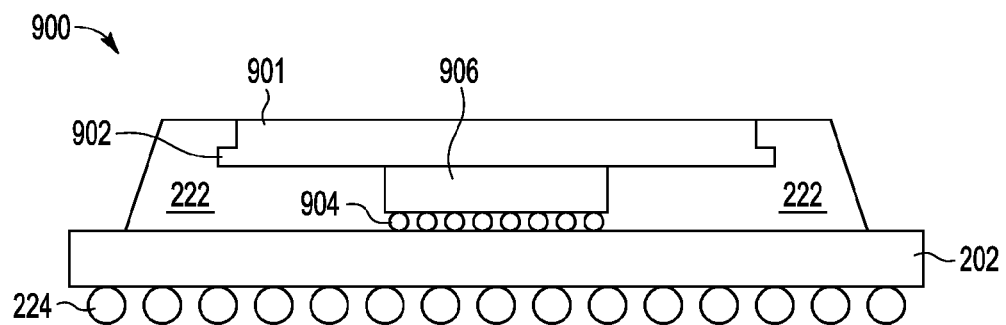
FIG. 9 shows another embodiment of a die assembly with an integrated heat spreader.

FIG. 9 shows another embodiment of a die assembly 900 with an integrated heater spreader 901 that includes locking features 902 that anchor heat spreader 901 to mold compound 222. In the example shown, locking features 902 include a stepped edge with a lower step extending beyond an upper edge. Mold compound 222 fills in above the lower step to resist separation of the heat spreader 901 from the mold compound 222.

FIG. 9 further shows flip chip IC die 906 that includes bumps 904 that form electrical interconnects with substrate 202 instead of wire bonds 206 that are used with IC die 204 (FIG. 2). Accordingly, heat spreader 901 does not require a pedestal to accommodate the wire bonds (not shown in FIG. 9) and can be flat across the bottom surface which includes the region bonded to the die 906.

While the mold compound 222 can also function as a molded underfill material in the gap under the die 906 in the space around flip chip bumps 904, it is also possible to apply an underfill prior to molding using a capillary underfill process. Alternatively, the underfill material could be pre-applied to the substrate 202 or die 906 and then the die 906 could be assembled to the substrate 202.

Figure 10:
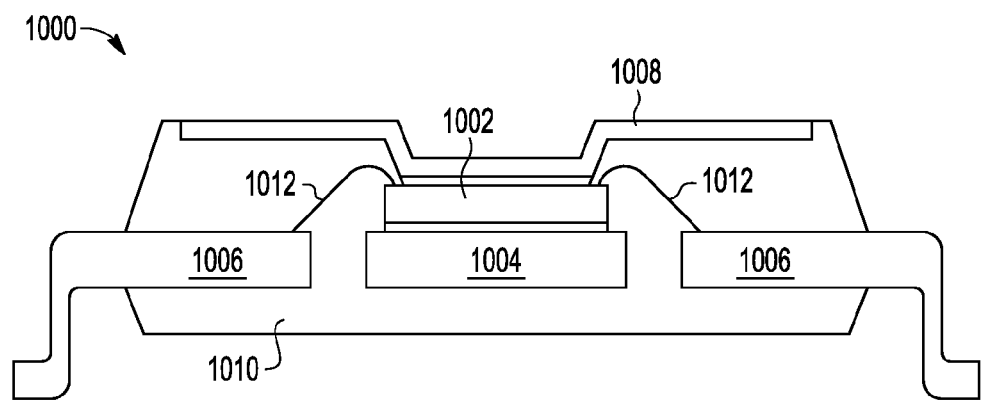
FIG. 10 shows another embodiment of a die assembly with an integrated heat spreader.

FIG. 10 shows another embodiment of a die assembly 1000 with an integrated heater spreader 1008 for an IC die 1002 mounted on a flag 1004 of a leadframe. Leads 1006 extend past the edges of mold compound 1010. Wire bonds 1012 are formed between IC die 1002 and leads 1006. Mold compound 1010 fills in space between the heat spreader 1008 and the lead frame, as well as an area below flag 1004 and leads 1006. The top of the mold compound 1010 is shown flush with the top surface of the heat spreader 1008. Due to the small compression of the ETFE film 214 the surfaces may not be flush, with the heat spreader surface being slightly raised above the plane of the mold compound surrounding the heat spreader.

By now it should be appreciated that embodiments of a method for forming a molded die assembly have been provided that comprises attaching (102, 104) a first major surface of a semiconductor die (204) onto a package substrate (202); and attaching (106) a heat spreader (212) to a second major surface of the semiconductor die. The second major surface is opposite the first major surface, and the semiconductor die, package substrate, and heat spreader form a die assembly (209). A die release film (214) is conformed (110) to a transfer mold (216). The transfer mold is closed (114) around the die assembly such that the die release film is compressed against the heat spreader and a cavity (220) is formed around the die assembly. A thermoset material (222) is transferred (116) into the cavity. The die assembly is released (116) from the die release film and the transfer mold.

In another aspect, the heat spreader can be attached to the second major surface of the die comprises using a thermal interface material (213) to attach the heat spreader to the second major surface.

In another aspect, the heat spreader can have a laterally extending portion which extends laterally beyond the semiconductor die. Transferring the thermoset material into the cavity can be performed such that the thermoset material is in direct physical contact with the laterally extending portion of the heat spreader.

In another aspect, transferring the thermoset material into the cavity can be performed such that the thermoset material is in direct physical contact with a sidewall of the laterally extending portion of the heat spreader.

In another aspect, the laterally extending portion of the heat spreader can include locking protrusions (902) that extend from a sidewall of the laterally extending portion of the heat spreader. The transferring the thermoset material into the cavity can be performed such that the thermoset material surrounds the locking protrusions.

In another aspect, a periphery of the laterally extending portion of the heat spreader can include a plurality of recessed regions (902). The transferring the thermoset material into the cavity can be performed such that the thermoset material fills the recessed regions.

In another aspect, the heat spreader can include a plurality of protruding portions (804) which extend from a major surface of the laterally extending portion of the heat spreader towards the package substrate. The transferring the thermoset material into the cavity can be performed such that the thermoset material surrounds the protruding portions In another aspect, attaching the first major surface of the semiconductor die onto the package substrate can include forming electrically conductive bumps (904) on the first major surface of the semiconductor substrate and attaching the bumps to the package substrate.

In another aspect, after attaching the first major surface of the semiconductor die onto the package substrate, wire bond connections (206) can be formed from the second major surface of the semiconductor die to the package substrate.

In another aspect, attaching the first major surface of the semiconductor die onto the package substrate can be further characterized in that the package substrate comprises a lead frame (1004, 1006).

In another aspect, after releasing the die assembly from the die release film and the transfer mold, the molded die assembly can be cured (120).

In other embodiments, methods for forming a molded die assembly can include attaching a first major surface of a semiconductor die (204) onto a package substrate (202), and attaching a heat spreader (212) to a second major surface of the semiconductor die using a thermal interface material (213). The second major surface is opposite the first major surface. The semiconductor die, package substrate, thermal interface material, and heat spreader form a die assembly (209). The heat spreader can include an extension portion which extends laterally beyond the semiconductor die. A die release film (214) can be conformed to a transfer mold (216). The transfer mold is closed around the die assembly such that the die release film is compressed against the heat spreader and a cavity (220) is formed around the die assembly. A thermoset material (222) is transferred into the cavity such that the thermoset material is in direct physical contact with the extension portion of the heat spreader. The die assembly is released from the die release film and the transfer mold, and after releasing the die assembly from the die release film and the transfer mold, the molded die assembly is cured.

In another aspect, transferring the thermoset material into the cavity can be performed such that the thermoset material is in direct physical contact with a sidewall of the extension portion of the heat spreader.

In another aspect, the extension portion of the heat spreader comprises locking protrusions (902) which extend from a sidewall of the extension portion of the heat spreader. The transferring the thermoset material into the cavity can be performed such that the thermoset material surrounds the locking protrusions.

In another aspect, a periphery of the extension portion of the heat spreader comprises a plurality of recessed regions (902). The transferring the thermoset material into the cavity can be performed such that the thermoset material fills the recessed regions.

In another aspect, the heat spreader comprises a plurality of protruding portions (804) which extend from a major surface of the extension portion of the heat spreader towards the package substrate. The transferring the thermoset material into the cavity can be performed such that the thermoset material surrounds the protruding portions In another aspect, attaching the first major surface of the semiconductor die onto the package substrate can include forming electrically conductive bumps (904) on the first major surface of the semiconductor substrate and attaching the bumps to the package substrate.

In another aspect, after attaching the first major surface of the semiconductor die onto the package substrate, wire bond connections (206) can be formed from the second major surface of the semiconductor die to the package substrate.

In another aspect, attaching the first major surface of the semiconductor die onto the package substrate can be further characterized in that the package substrate comprises a lead frame (1004, 1006).

In still other embodiments, a molded die assembly can include a package substrate (202), a semiconductor die (204, 906, 1002) over the package substrate, and a heat spreader (212, 802, 902, 1008) over the semiconductor die. The heat spreader can include a die attach region and an extension portion which extends laterally beyond die attach region and the semiconductor die. A thermal interface material (213) can be included between the heat spreader and semiconductor die. The thermal interface material is in direct physical contact with the die attach region of the heat spreader and the semiconductor die. A thermoset material (222) surrounds the semiconductor die and in direct physical contact with the package substrate, the extension portion of the heat spreader, and a sidewall of the extension portion of the heat spreader.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a molded die assembly, comprising:

attaching a first major surface of a semiconductor die onto a package substrate;

attaching a heat spreader to a second major surface of the semiconductor die, wherein the second major surface is opposite the first major surface, the heat spreader includes a pedestal portion that contacts the semiconductor die and side extensions that are raised above the pedestal and the semiconductor die when the heat spreader is mounted above the semiconductor die, and the semiconductor die, package substrate, and heat spreader form a die assembly;

conforming a die release film to a transfer mold;

closing the transfer mold around the die assembly such that the die release film is compressed against the heat spreader and a cavity is formed around the die assembly;

transferring a thermoset material into the cavity; and releasing the die assembly from the die release film and the transfer mold, wherein a top surface of the thermoset material is substantially flush with a majority of a top surface of the side extensions of the heat spreader.

2. The method of claim 1, wherein attaching the heat spreader to the second major surface of the die comprises using a thermal interface material to attach the heat spreader to the second major surface.

3. The method of claim 1, wherein the heat spreader has a laterally extending portion which extends laterally beyond the semiconductor die, wherein transferring the thermoset material into the cavity is performed such that the thermoset material is in direct physical contact with the laterally extending portion of the heat spreader.

4. The method of claim 3, wherein transferring the thermoset material into the cavity is performed such that the thermoset material is in direct physical contact with a sidewall of the laterally extending portion of the heat spreader.

5. The method of claim 3, wherein the laterally extending portion of the heat spreader comprises locking protrusions which extend from a sidewall of the laterally extending portion of the heat spreader, wherein the transferring the thermoset material into the cavity is performed such that the thermoset material surrounds the locking protrusions.

6. The method of claim 3, wherein a periphery of the laterally extending portion of the heat spreader comprises a plurality of recessed regions, wherein the transferring the thermoset material into the cavity is performed such that the thermoset material fills the recessed regions.

7. The method of claim 3, wherein the heat spreader comprises a plurality of protruding portions which extend from a major surface of the laterally extending portion of the heat spreader towards the package substrate, wherein the transferring the thermoset material into the cavity is performed such that the thermoset material surrounds the protruding portions.

8. The method of claim 1, wherein attaching the first major surface of the semiconductor die onto the package substrate comprises forming electrically conductive bumps on the first major surface of the semiconductor substrate and attaching the bumps to the package substrate.

9. The method of claim 1, further comprising:
after attaching the first major surface of the semiconductor die onto the package substrate, forming wire bond connections from the second major surface of the semiconductor die to the package substrate.

10. The method of claim 1, wherein attaching the first major surface of the semiconductor die onto the package substrate is further characterized in that the package substrate comprises a lead frame.

11. The method of claim 1, further comprising:
after releasing the die assembly from the die release film and the transfer mold, curing the molded die assembly.

12. A method for forming a molded die assembly, comprising:

attaching a first major surface of a semiconductor die onto a package substrate;

attaching a heat spreader to a second major surface of the semiconductor die using a thermal interface material, wherein the second major surface is opposite the first major surface, wherein the semiconductor die, package substrate, thermal interface material, and heat spreader form a die assembly, and the heat spreader comprises a pedestal portion and an extension portion, the extension portion extends laterally beyond the semiconductor die and is raised above the pedestal portion and the semiconductor die when the heat spreader is attached to the second major surface of the semiconductor die;

conforming a die release film to a transfer mold;

closing the transfer mold around the die assembly such that the die release film is compressed against the heat spreader and a cavity is formed around the die assembly;

transferring a thermoset material into the cavity such that the thermoset material is in direct physical contact with the extension portion of the heat spreader;

releasing the die assembly from the die release film and the transfer mold; and after releasing the die assembly from the die release film and the transfer mold, curing the molded die assembly, wherein a top surface of the thermoset material is substantially flush with a top surface of the extension portion of the heat spreader and a top surface of the pedestal portion is flush with the to surface of the extension portion of the heat spreader.

13. The method of claim 12, wherein transferring the thermoset material into the cavity is performed such that the thermoset material is in direct physical contact with a sidewall of the extension portion of the heat spreader.

14. The method of claim 13, wherein the extension portion of the heat spreader comprises locking protrusions which extend from a sidewall of the extension portion of the heat spreader, wherein the transferring the thermoset material into the cavity is performed such that the thermoset material surrounds the locking protrusions.

15. The method of claim 13, wherein a periphery of the extension portion of the heat spreader comprises a plurality of recessed regions, wherein the transferring the thermoset material into the cavity is performed such that the thermoset material fills the recessed regions.

16. The method of claim 13, wherein the heat spreader comprises a plurality of protruding portions which extend from a major surface of the extension portion of the heat spreader towards the package substrate, wherein the transferring the thermoset material into the cavity is performed such that the thermoset material surrounds the protruding portions.

17. The method of claim 12, wherein attaching the first major surface of the semiconductor die onto the package substrate comprises forming electrically conductive bumps on the first major surface of the semiconductor substrate and attaching the bumps to the package substrate.

18. The method of claim 12, further comprising:
after attaching the first major surface of the semiconductor die onto the package substrate, forming wire bond connections from the second major surface of the semiconductor die to the package substrate.

19. The method of claim 12, wherein attaching the first major surface of the semiconductor die onto the package substrate is further characterized in that the package substrate comprises a lead frame.

20. A molded die assembly, comprising:
   a package substrate;
   a semiconductor die over the package substrate;
   a heat spreader over the semiconductor die, wherein the heat spreader includes a solid die attach region and a solid extension portion which extends laterally beyond the die attach region and the semiconductor die, wherein the heat spreader is mounted only to a top surface of the semiconductor die and a top surface of the die attach region and the semiconductor die are below the extension portion;
   a thermal interface material between the heat spreader and semiconductor die, wherein the thermal interface material is in direct physical contact with the die attach region of the heat spreader and the semiconductor die; and
   a thermoset material surrounding the semiconductor die and in direct physical contact with the package substrate, the extension portion of the heat spreader, and a sidewall of the extension portion of the heat spreader, wherein a top surface of the thermoset material is substantially flush with a majority of a top surface of the extension portion of the heat spreader.

\* \* \* \* \*